United States Patent
Lemoff et al.

(10) Patent No.: US 7,004,645 B2
(45) Date of Patent: Feb. 28, 2006

(54) VCSEL ARRAY CONFIGURATION FOR A PARALLEL WDM TRANSMITTER

(75) Inventors: Brian E. Lemoff, Union City, CA (US); Robert E. Wilson, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 122 days.

(21) Appl. No.: 10/427,671

(22) Filed: Apr. 30, 2003

(65) Prior Publication Data

US 2004/0218875 A1 Nov. 4, 2004

(51) Int. Cl.
*G02B 6/43* (2006.01)

(52) U.S. Cl. ............................ 385/89; 385/33; 385/14; 385/49; 385/88; 398/88; 398/82; 372/43

(58) Field of Classification Search ................... 372/28, 372/43; 385/31, 33, 34, 14, 49, 88, 89, 92–94, 385/114; 398/82, 88, 101, 103, 48, 50
See application file for complete search history.

(56) References Cited

U.S. PATENT DOCUMENTS

| | | | |
|---|---|---|---|
| 6,015,998 A | 1/2000 | Bergmann | |
| 6,088,376 A | 7/2000 | O'Brien et al. | |
| 6,353,502 B1 | 3/2002 | Marchant et al. | |
| 6,419,404 B1 * | 7/2002 | Deri et al. | 385/89 |
| 6,731,665 B1 * | 5/2004 | Trezza | 395/24 |
| 2002/0009258 A1 | 1/2002 | Coldren et al. | |
| 2002/0031313 A1 | 3/2002 | Williams | |
| 2002/0041741 A1 | 4/2002 | Ciemiewicz | |
| 2002/0067882 A1 * | 6/2002 | Guifoyle | 385/24 |
| 2003/0030910 A1 * | 2/2003 | Teng | 359/586 |
| 2004/0061346 A1 * | 4/2004 | Capewell | 294/64.1 |
| 2004/0101247 A1 * | 5/2004 | Chen et al. | 385/47 |
| 2004/0218875 A1 * | 11/2004 | Lemoff et al. | 385/89 |

FOREIGN PATENT DOCUMENTS

WO 01/75495 A2 10/2001

* cited by examiner

*Primary Examiner*—Fayez G. Assaf
(74) *Attorney, Agent, or Firm*—Juergen Krause-Polstorff

(57) ABSTRACT

VCSEL array configurations for use with parallel WDM transmitters are disclosed. Transmitters that use several wavelengths of VCSELs are built up out of multiple die to avoid the difficulty of manufacturing monolithic arrays of VCSELs with different optical wavelengths. VCSEL configurations are laid out to insure that VCSELs of different wavelengths that destined for the same waveguide are close together.

16 Claims, 9 Drawing Sheets

VCSEL ARRAY CONFIGURATION FOR A PARALLEL WDM TRANSMITTER

CROSS-REFERENCE TO RELATED APPLICATIONS

This application is related to the patent application entitled "APPARATUS AND METHOD FOR A FILTERLESS PARALLEL WDM MULTIPLEXER", U.S. Application Ser. No. 10/428,198 filed on the same day and assigned to the same assignee.

BACKGROUND OF INVENTION

Two optical communications techniques that enable increased bandwidth density in communications systems are parallel optics and wavelength division multiplexing (WDM). In parallel optics, multiple optical data signals are typically transmitted along a multi-fiber ribbon, with a single optical signal being transmitted on each fiber. In WDM, multiple optical data signals are combined and transmitted along a single optical fiber, with each optical signal being carried on a different wavelength.

Parallel WDM combines the two communications techniques by transmitting multiple optical wavelengths through each fiber of the multi-fiber ribbon. Parallel optical transmitters are typically constructed from monolithic arrays of vertical cavity surface emitting lasers (VCSELs) operating at single wavelength. Because it is typically difficult to manufacture monolithic arrays of VCSELs operating at different wavelengths, a parallel WDM transmitter that operates VCSELs at several wavelengths is typically built out of multiple dies. It is typically advantageous for VCSELs of different wavelengths to be close together because the light from several different wavelength VCSELs typically must be combined into a single optical fiber using an optical multiplexer.

SUMMARY OF INVENTION

In accordance with the invention, specific VCSEL array configurations of VCSEL die are described that are consistent with compact filterless optical multiplexers and low-cost manufacturing for realizing parallel WDM transmitters. VCSELs of different wavelengths whose light is destined for the same waveguide are configured to be close together.

DETAILED DESCRIPTION

Figure 1:
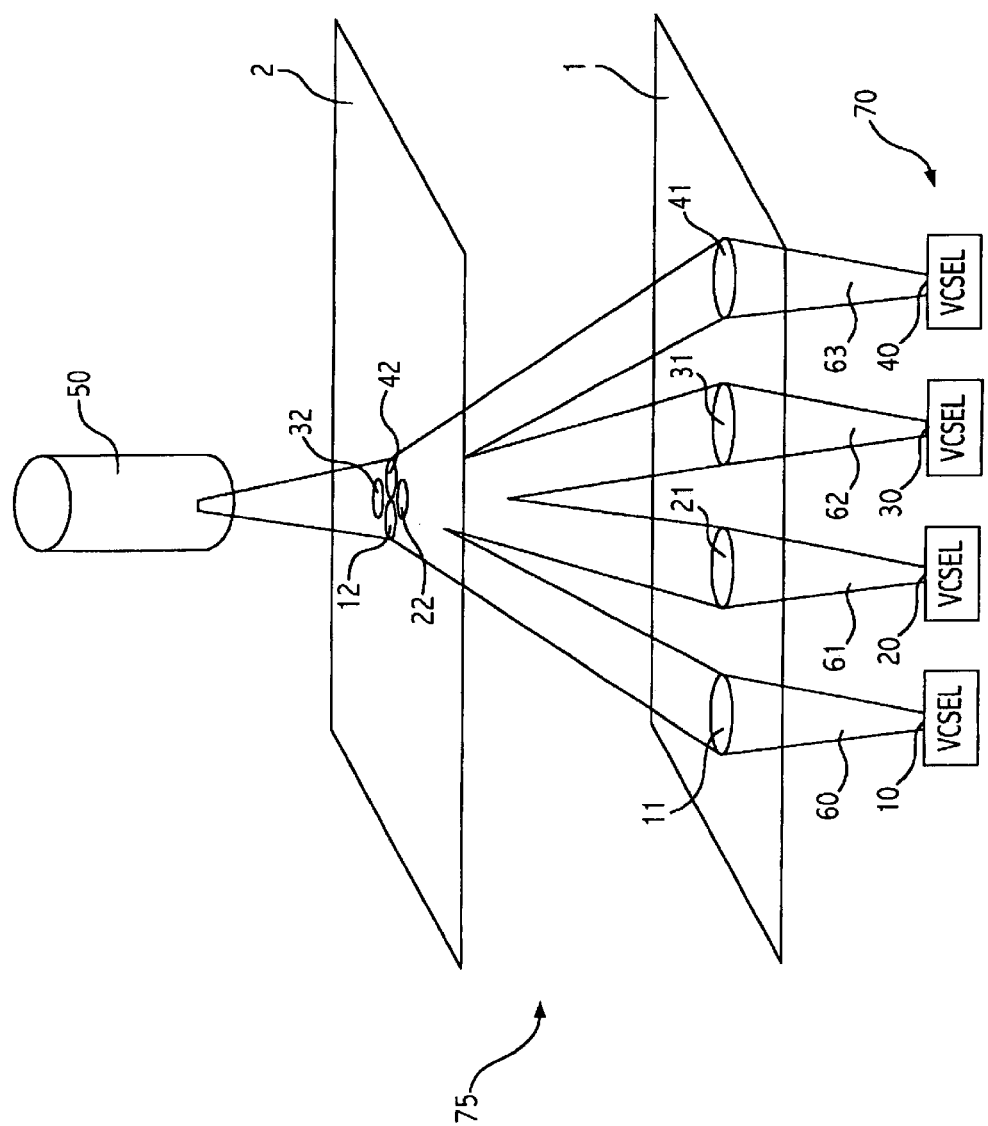
FIG. 1 shows a simplified conceptual view of an element of a parallel WDM transmitter in accordance with the invention.

In accordance with the invention, a configuration of VCSELs may be arranged as linear arrays, n by n arrays or other geometries in accordance with the invention. FIG. 1 shows a conceptual view of an embodiment in accordance with the invention. Filterless parallel WDM multiplexer element 75 is used to direct light from VCSEL configuration 70, comprising VCSELs 10, 20, 30, 40 to optical fiber 50. The number of VCSELs and lenses may be increased along with the number of optical fibers. Using two or more filterless parallel WDM multiplexer elements 75 with two or more optical fibers, respectively, results in a filterless parallel WDM multiplexer as shown by, for example, filterless parallel WDM multiplexer 201 in FIG. 4.

Lenses in plane 1 such as lenses 11, 21, 31, 41 are typically made just large enough to collect most of the light emitted by VCSELs 10, 20, 30, 40 such as beams 60, 61, 62, 63, respectively. The general design considerations are as follows. Because a VCSEL typically emits a vertical cone of light, the center of the lens aperture in plane 1 should be aligned with the VCSEL aperture to capture the VCSEL light. In order to direct light from a first lens in a first plane to the appropriate lens in the a second plane, the vertex of the first lens must lie on the line connecting the VCSEL aperture to the center of the appropriate lens aperture in the second plane. This results in an offset between the center of the first lens aperture and the vertex of the first lens. Therefore, the first lens is an off-axis section of a lens. The appropriate lens in the second plane needs to be large enough to capture most of the light incident on it and focus this light into the optical fiber. The lens in the second plane focuses the incident light into the optical fiber which is positioned to minimize the overall range of angles of the incident light going into the optical fiber. Because the lens in the second plane needs to focus the incident into the optical fiber, the line connecting the optical fiber center with the lens vertex needs to be parallel to the incident light which by design is parallel to the line connecting the VCSEL aperture to the center of the lens in second plane. This requires that there be an offset between the center of the lens aperture in the second plane and the lens vertex. Hence, the lens in second plane is also off-axis. The other lenses of the multiplexer and any additional optical fibers are similarly positioned.

The general design considerations discussed above assume that the VCSEL is a point source which is an approximation. Additional assumptions have neglected diffraction and lens aberrations. The design implementation of WDM multiplexer corrects for these factors and the implementation typically will differ from the above description that, however, results in a baseline design that is qualitatively similar to the actual implementation. In practice, the qualitative description provides a starting configuration that may be iteratively modified using ray tracing software packages such as ZEMAX® or CODE V® until the amount of VCSEL light reaching the optical fiber has been optimized.

With respect to FIG. 1, for example, VCSEL 10 is lined up with the center of lens 11 and lens 11 needs to be large enough to capture most of the light from VCSEL 10. The vertex of lens 11 lies in plane 1 on the line defined by VCSEL 10 and the center of lens 12. Hence, the vertex of lens 11 and the center of the aperture of lens 10 are offset from each other and lens 11 is an off-axis lens. Lens 12 in plane 2 needs to be sufficiently large to collect most of the light incident on it and focus that light into optical fiber 50. Lens 12 focuses most of the incident light into optical fiber 50 which is positioned to minimize the overall range of angles of the incident light that is entering optical fiber 50. Because lens 12 focuses the light into optical fiber 50, the line connecting the center of optical fiber 50 needs to be parallel to the incident light. By design, the incident light is parallel to the line connecting the aperture of VCSEL 10 to the center of lens 12 in plane 2. This requires that the vertex of lens 12 and the center of the aperture of lens 12 are offset from each other. Hence, lens 12 is also an off-axis lens. Similar considerations apply for lenses 21, 31, 41 in plane 1 and lenses 22, 32, 42 in plane 2.

In FIG. 1, each of VCSELs 10, 20, 30, 40 operates at a separate wavelength to generate light beams 60, 61, 62, 63, each light beam being at a particular wavelength. VCSELs 10, 20, 30, 40 typically reside on separate die. Light beams 60, 61, 62, 63 enter filterless parallel WDM multiplexer 75 having two planes of lenses. In FIG. 1, VCSELs 10, 20, 30, 40 transmit light beams 60, 61, 62, 63 to lenses 11, 21, 31, 41 residing in first lens plane 1. Lenses 11, 21, 31, 41 function to redirect beams 60, 61, 62, 63 into lenses 12, 22, 32, 42, respectively. Lenses 12, 22, 32, 42 residing in second lens plane 2 function to direct light beams 60, 61, 62, 63, respectively, into optical fiber 50. Hence, light of four different wavelengths is multiplexed into optical fiber 50.

Figure 2A:
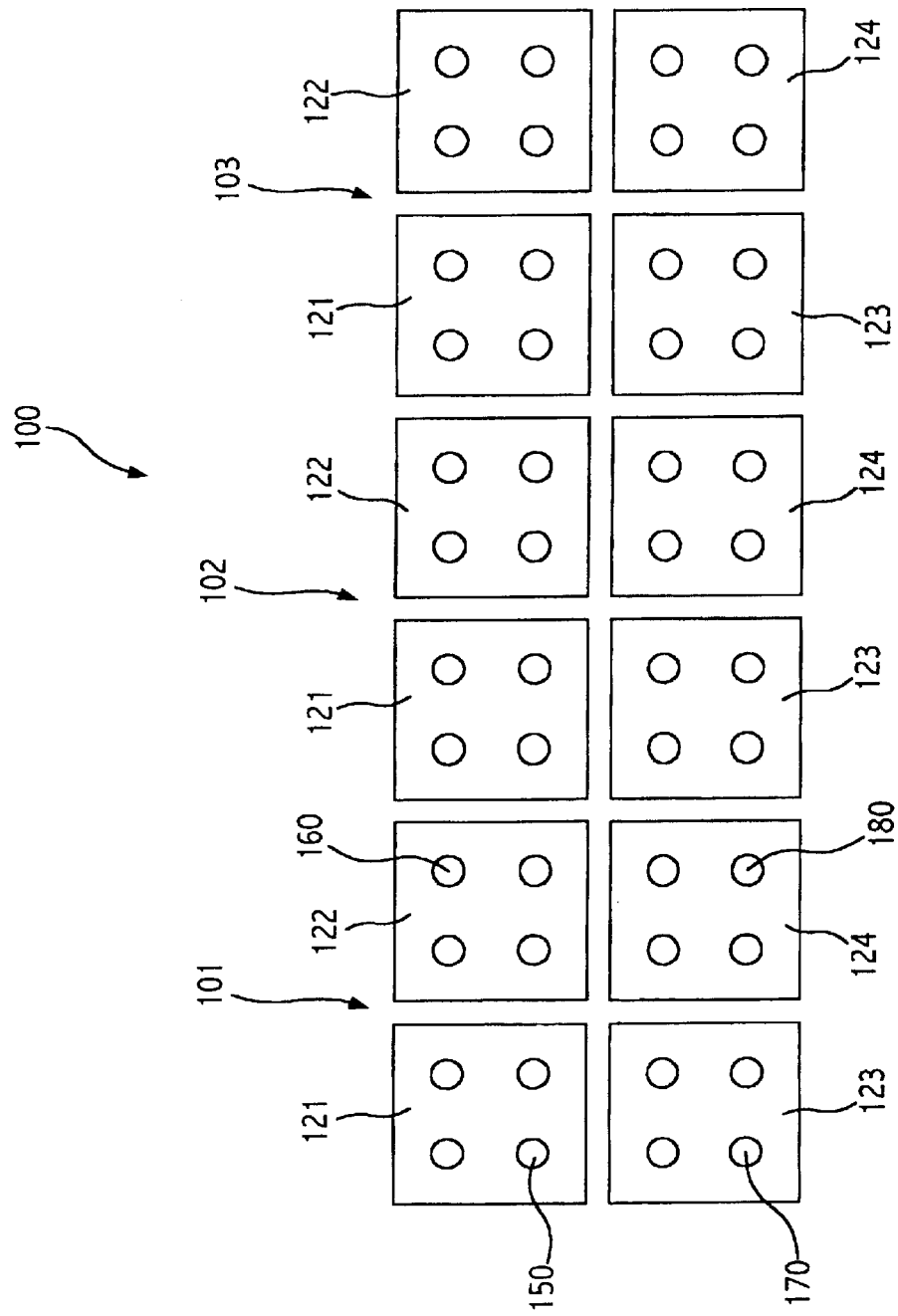
FIG. 2a shows an embodiment in accordance with the invention.

FIG. 2a shows an embodiment of a VCSEL array configuration for a parallel WDM transmitter in accordance with the invention. Configuration 100 shown in FIG. 2a is a four wavelength, twelve optical fiber or waveguide configuration constructed from two-dimensional single wavelength monolithic VCSEL arrays. In this embodiment, there are three groups 101, 102, 103 of four square dies 121, 122, 123, 124 corresponding to two by two VCSEL arrays 150, 160, 170, 180, respectively. The number of die and groups in the configuration may be increased in accordance with the invention to allow for both more wavelengths and optical fibers or waveguides. VCSEL arrays 150, 160, 170, 180 each operate at a different wavelength. Dies 121, 122, 123, 124 are arranged such that each group of square die 101, 102, 103 contain VCSEL arrays for each of the four wavelengths. This arrangement ensures that devices of different wavelengths are sufficiently close together to avoid the need for large angle deflections within multiplexer element 75 (i.e. between planes 1 and 2) to direct the light beams into optical fiber 50. The need for large angle deflections using refractive lenses presents a cost issue and using diffractive lenses results in higher light losses.

The substantially square aspect ratio of dies 121, 122, 123, 124 improves handleability in the manufacturing environment and reduces handling breakage. VCSEL material is typically brittle and VCSEL structures with a high aspect ratio are inherently more susceptible to damage than VCSEL structures with a low aspect ratio. Long VCSEL arrays (high aspect ratio) have proportionally more surface area than square VCSEL arrays (low aspect ratio). For example, a three by three VCSEL array on a 250 μm pitch has nine devices with a perimeter of 3000 μm whereas a one by nine VCSEL array also has nine devices but for the same pitch has a 5000 μm perimeter. Because cracks usually start on the die perimeter, reducing the die perimeter typically increases the VCSEL array yield. Additionally, long VCSEL arrays are typically subject to more stress due to thermally induced stresses resulting from attachment to the substrate material.

Conventional production tooling is typically designed to handle parts that have a low aspect ratio. The majority of semiconductor devices have a relatively low aspect ratio (typically an approximately square shape when viewed from the top or bottom) and as a result the conventional production tooling is typically designed to accommodate such low aspect ratio shapes.

Figure 2B:
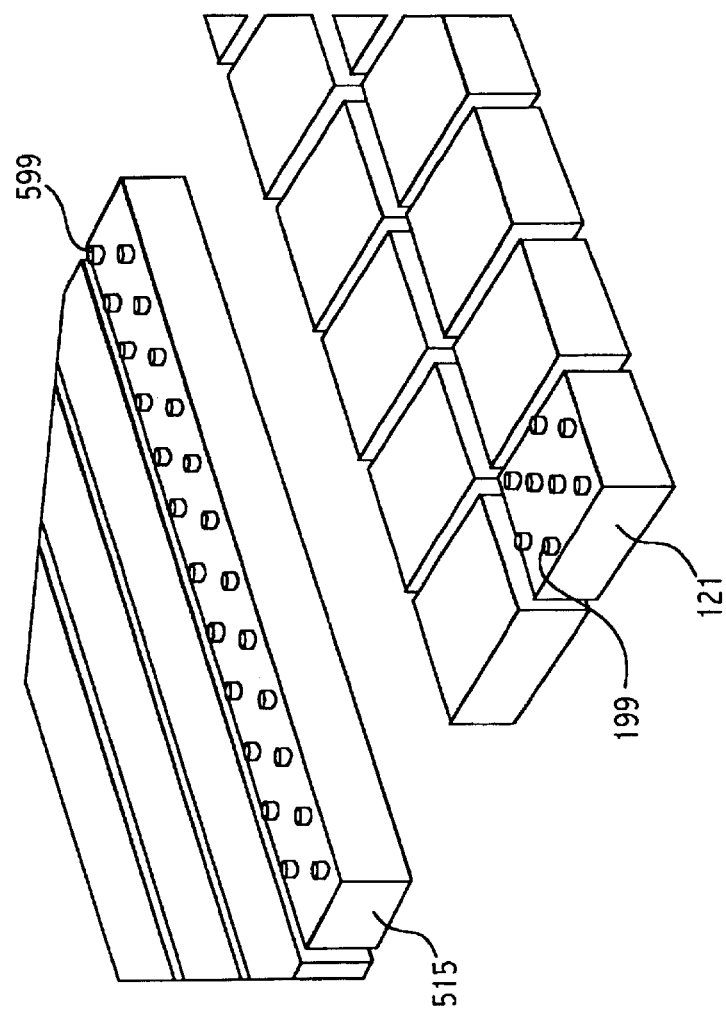
FIG. 2b shows a simplified view of solder bumps on two embodiments in accordance with the invention.

Using two by two VCSEL arrays 150, 160, 170, 180 located on die 121, 122, 123, 124, respectively, the arrangement of the bond-pads (not shown) on each die 121, 122, 123, 124 allows the use of solder reflow self-alignment during alignment and attachment decreasing assembly costs. Typically, solder reflow self alignment is more effective for two by two arrays such as VCSEL arrays 150, 160, 170, 180. FIG. 2b shows a simplified view of solder bumps 199 and 599 on the bottom of die 121 and die 515, respectively (see FIG. 5). Solder bumps 199 and 599 act to self align die 121 and die 515, respectively, during reflow.

The self-alignment mechanism is due to minimization of the surface tension at each of the individual solder attachment sites so that at each solder attachment site the surface tension is minimized. Each solder bump has a somewhat different volume and wets the bonding pads somewhat differently. The differences are relatively small but cause each solder bump to pull dies 121 and 515 in a different direction. A vector summing of the various forces occurs resulting in the final positioning of die 121 and 515. Because a two by two VCSEL array has a higher degree of symmetry than a one by twelve VCSEL array, better alignment typically results for a two by two VCSEL array or other VCSEL arrays having a higher degree of symmetry than a one by twelve array VCSEL array.

The size of two by two VCSEL arrays 150, 160, 170 180 can be reduced in size to the minimum size needed for solder bumps to attach VCSEL arrays 150, 160, 170, 190 to the substrate. For example, if sufficiently small solder bumps are used to attach two by two VCSEL arrays 150, 160, 170, 180 that are 150 μm on a side, the VCSEL array size will work with filterless parallel WDM multiplexer 201 (see FIG. 4) even if the pitch of the optical fiber array is 250 μm. In contrast, for one by twelve VCSEL arrays 511, 521, 531, 541 (see FIG. 5), the pitch of the VCSEL array is constrained by and must match the pitch of the optical fiber array. Because the cost of VCSEL die is proportional to their area cost may be reduced by reducing area. In addition, having a relatively small number of devices per die increases the yield per die. For example, if 5% of the VCSELs in a one by twelve VCSEL arrays 511, 521, 531, 541 are defective, the array yield will be about 54% if the defects are random. For two by two VCSEL arrays 150, 160, 170, 180 with the same defect rate of 5%, the array yield will be 81%. Because yield per die is proportional to cost, smaller arrays are much cheaper.

Figure 3A:
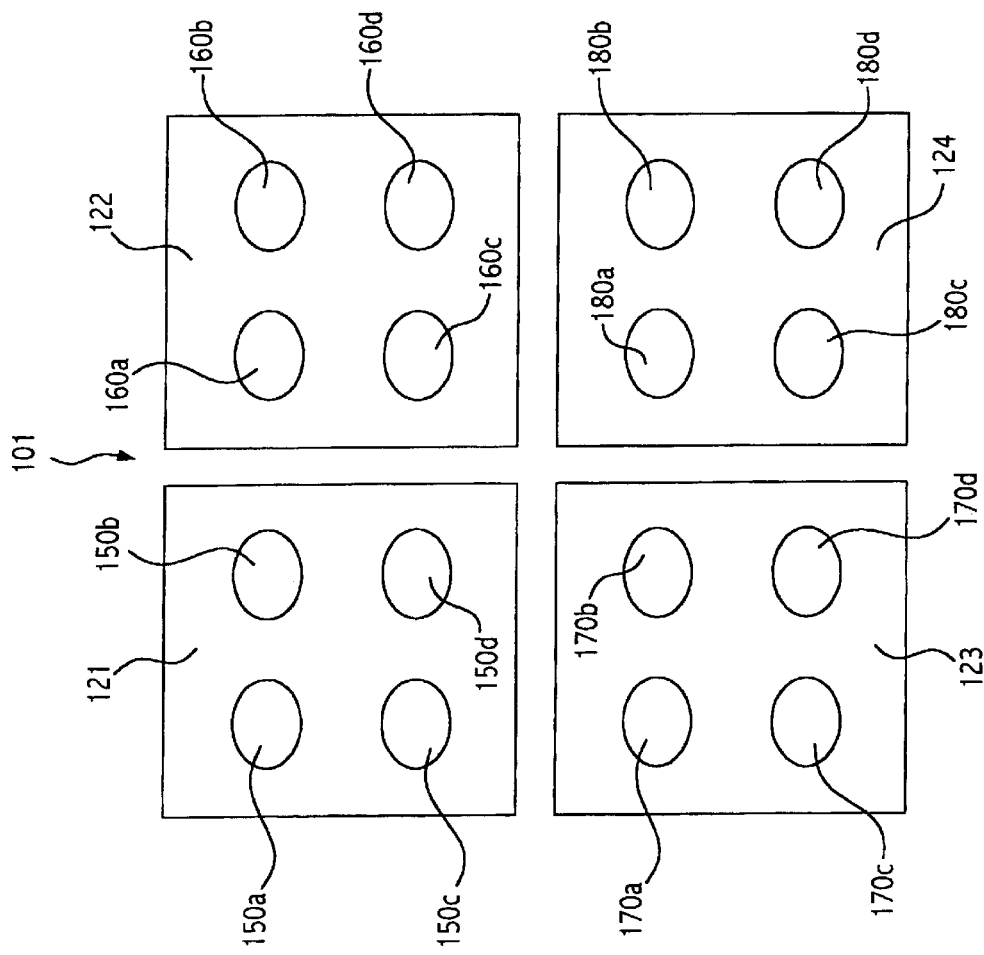
FIG. 3a shows a group of VCSEL die in accordance with the invention.
Figure 3B:
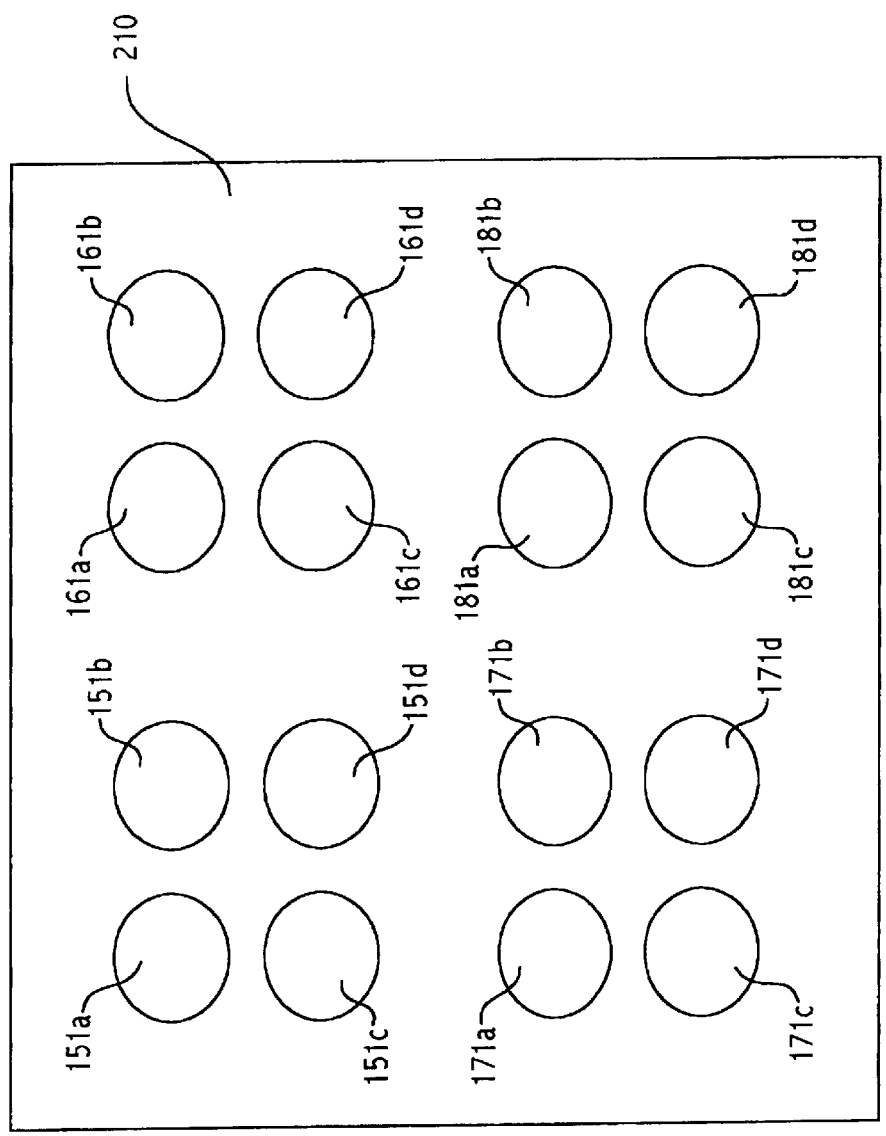
FIG. 3b shows a first plane of lenses forming part of an optical multiplexer in accordance with an embodiment of the invention.

FIG. 3a shows group 101 of FIG. 2 with VCSEL apertures 150a–150d, 160a–160d, 170a–170d, 180a–180d of VCSEL arrays 150, 160, 170, 180, respectively, labeled to illustrate how light is optically directed from the individual VCSELs into the optical fibers. FIG. 3b shows the portion of first lens plane 210, corresponding to group 101, used to multiplex the light from VCSEL arrays 150, 160, 170, 180 into optical fibers for the embodiment in FIG. 1. Each of lenses 151a–d, 161a–d, 171a–d, 181a–d in first lens plane 210 is offset in the horizontal plane with respect to VCSEL apertures 150a–d, 160a–d, 170a–d, 180a–d, respectively. This allows light coming from the VCSEL apertures 150a–d, 160a–d, 170a–d, 180a–d through lenses 151a–d, 161a171a–d, 181a–d to be directed at an angle to intersect corresponding lenses 152a–d, 162a–d, 172a–d, 182a–d in second lens plane 220 (see FIG. 3c).

Figure 3C:
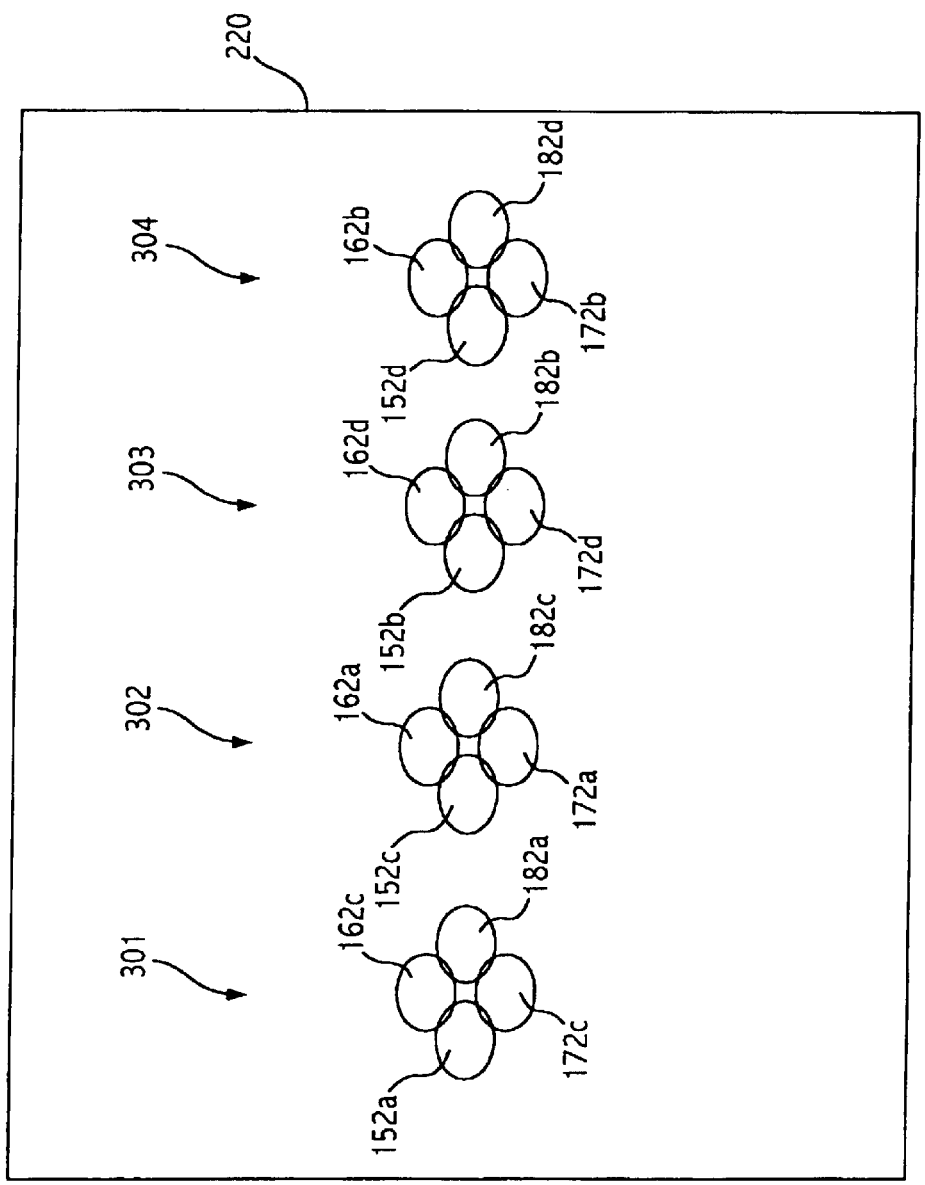
FIG. 3c shows a second plane of lenses forming part of an optical multiplexer in accordance with an embodiment of the invention.

FIG. 3c shows how light from first lens plane 210 is mapped into lenses 152a–d, 162a–d, 172a–d, 182a–d in second lens plane 220 as viewed from the optical fiber side. Lenses 152a–d, 162a–d, 172a–d, 182a–d in second lens plane 220 are positioned so that light from lens groups 301, 302, 303, 304 is focused into optical fibers 352, 362, 372, 382, respectively. Starting from the nine o'clock position in each group and going clockwise, lens group 301 has lenses 152a, 162c, 182a, 172c; lens group 302 has lenses 152c, 162a, 182c, 172c, lens group 303 has lenses 152b, 162d, 182b, 172d; lens group 304 has lenses 152d, 162b, 182d, 172b. The axis of each optical fiber 352, 362, 372, 382 is aligned with the center of lens groups 304, 303, 302, 301, respectively. Lenses in each lens group 304, 303, 302, 301 are positioned such that the four lenses in each group focus the light into optical fibers 352, 362, 372, 382, respectively. Light from lens 151a is directed to lens 152a; light from lens 151b is directed to lens 152b; light from lens 151c is directed to lens 152c; light from lens 151d is directed to 152d; light from lens 161a is directed to lens 162a; light from lens 161b is directed to lens 162b; light from lens 161c is directed to lens 162c; light from lens 161d is directed to lens 162d; light from lens 171a is directed to lens 172a; light from lens 171b is directed to lens 172b; light from lens 171c is directed to 172c; light from lens 171d is directed to 172d; light from lens 181a is directed to lens 182a; light from lens 181b is directed to lens 182b; light from lens 181c is directed to lens 182c; light from lens 181d is directed to lens 182d.

Figure 4:
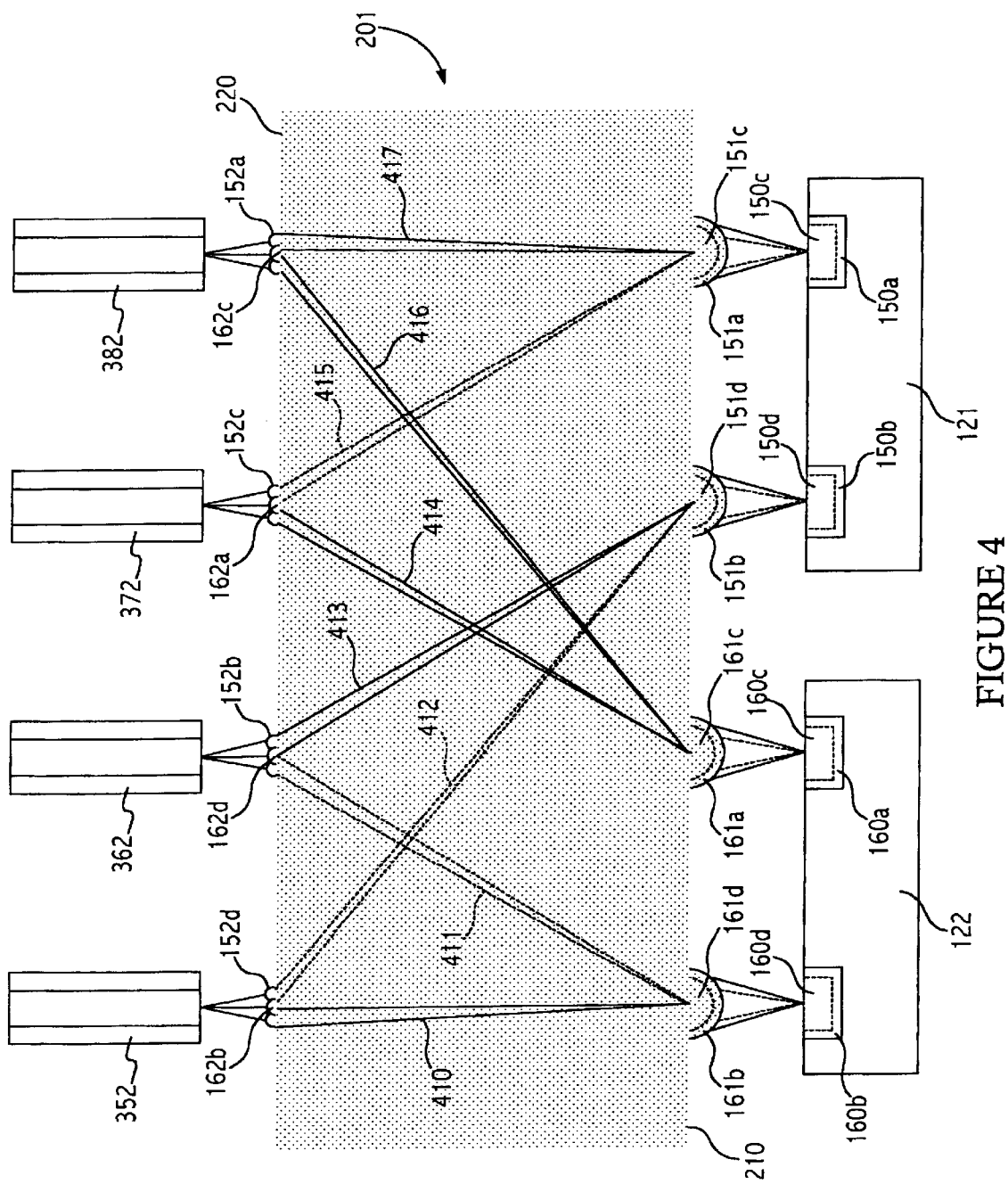
FIG. 4 shows a simplified view of a parallel WDM transmitter in accordance with an embodiment of the invention.

The mapping of the light beams between first lens plane 210 and second lens plane 220 is designed to minimize the largest required angular bending of the light within the configuration constraints. FIG. 4 shows a side view of the configuration shown in top view in FIGS. 3a–3c showing VCSEL arrays 150 and 160 and the position of optical fibers 352, 362, 372, 382. VCSEL arrays 170 and 180 are not shown to aid clarity. Dashed lines in FIG. 4 relate to the hidden VCSEL apertures 160d, 160c, 150d, 150c and corresponding hidden lenses 161d, 161c, 151d, 151c.

FIG. 4 shows the mapping by optical multiplexer 201 of light beams 410, 411, 412, 413, 414, 415, 416, 417 from lens plane 210 to lens plane 220 and into optical fibers 352, 362, 372, 382. Light beam 410 originates from VCSEL aperture 160b passing through lens 161b to lens 162b and into optical fiber 352. Light beam 411 originates from VCSEL aperture 160d passing through lens 161d to lens 162d and into optical fiber 362. Light beam 414 originates from VCSEL aperture 160a passing through lens 161a to lens 162a and into optical fiber 372. Light beam 416 originates from VCSEL aperture 160c passing through lens 161c to lens 162c and into optical fiber 382. Light beam 412 originates from VCSEL aperture 150d passing through lens 151d to lens 152d and into optical fiber 352. Light beam 413 originates from VCSEL aperture 150b passing through lens 151b to lens 152b and into optical fiber 362. Light beam 415 originates from VCSEL aperture 150c passing through lens 151c to lens 152c and into optical fiber 372. Light beam 417 originates from VCSEL aperture 150a passing through lens 151a to lens 152a and into optical fiber 382.

Figure 5:
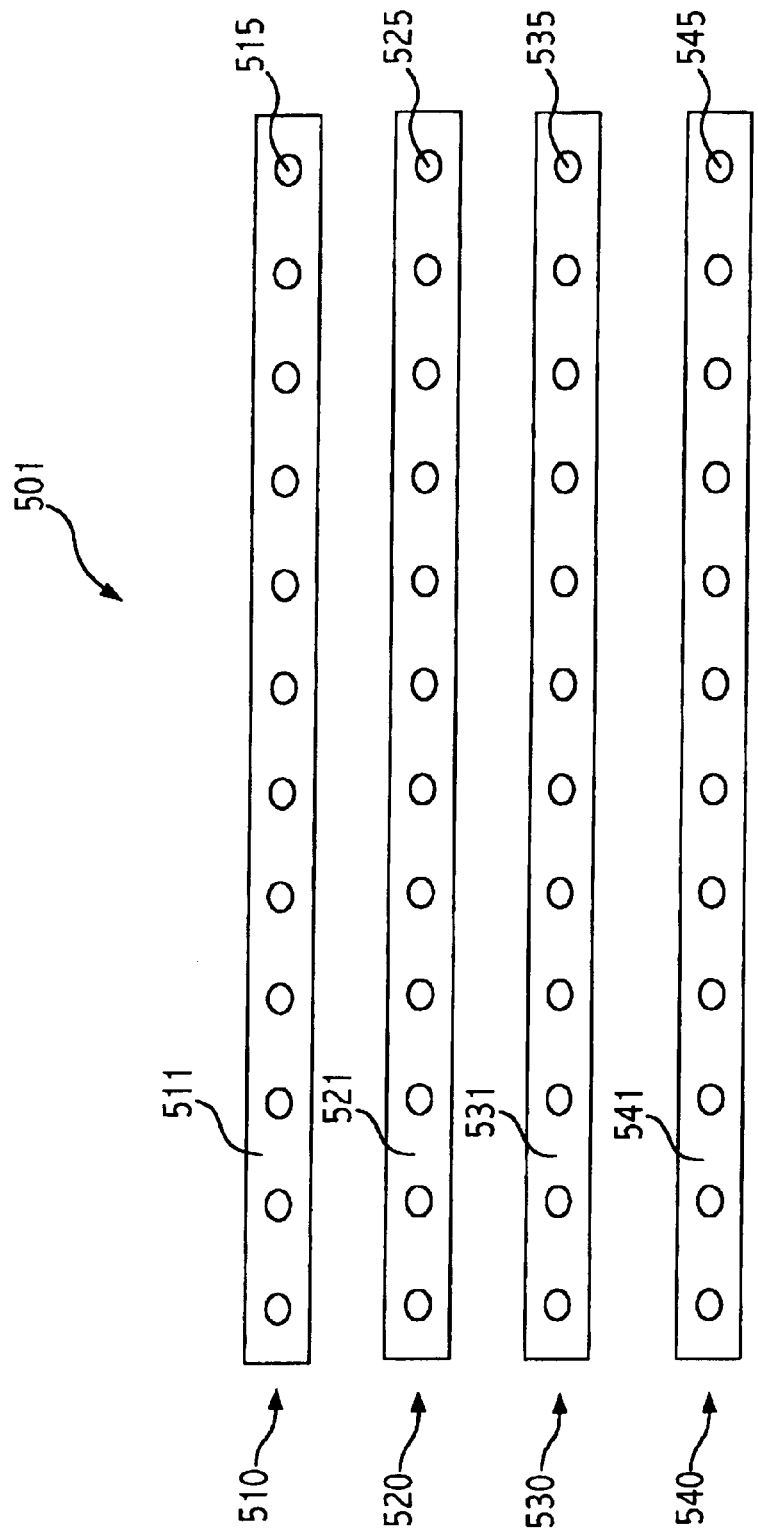
FIG. 5 shows an embodiment in accordance with the invention.

FIG. 5 shows an embodiment of VCSEL array configuration 501 in accordance with the invention, each VCSEL array being a one by twelve array. Each of die 510, 520, 530, 540 contains the same number of VCSELs 515, 525, 535, 545, respectively, as the number of optical fibers (not shown). The embodiment shown is for use with 12 optical fibers and four wavelengths. Hence, there are four monolithic 12 element VCSEL arrays 511, 521, 531, 541, with each VCSEL array operating at a different wavelength. To have VCSELs of different wavelengths closely spaced, the optimal configuration for the four die approach is for each die 510, 520, 530, 540 to be a one by twelve linear array where the width is minimized. Typically, VCSEL arrays 511, 521, 531, 541 might be about 3000 μm long and only about 200 μm wide. This embodiment minimizes the number of single-wavelength die that need to be used and is amenable to use with a number of multiplexing schemes such as the interference-filter-based zigzag geometry described in U.S. Pat. No. 6,198,864 used in the reverse direction as a multiplexer. The high aspect ratio of die 510, 520, 530, 540 has the disadvantage that the die are difficult to manipulate, susceptible to breakage and the relatively large number of VCSELs per die reduces the overall yield per die.

Figure 6:
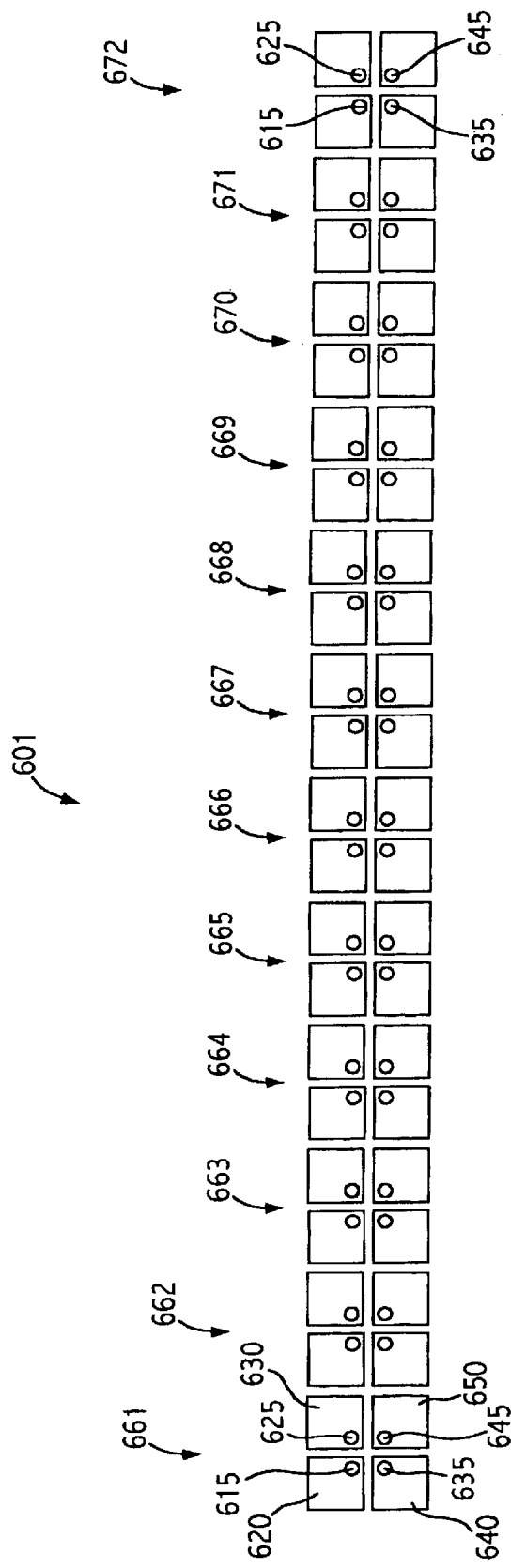
FIG. 6 shows an embodiment in accordance with the invention.

FIG. 6 shows an embodiment of VCSEL configuration 601 in accordance with the invention. The embodiment shown is for use with 12 optical fibers (not shown) and four wavelengths and uses one die for each VCSEL resulting in 48 die. Configuration 601 provides the tightest possible spacing of VCSELs of different wavelengths subject to the constraint of one VCSEL per die. Device yield is maximized because there is only one device per die. However, due to the maximization of the number of die, time and cost for assembly are increased.

VCSEL apertures 615, 625, 635, 645, one aperture for each VCSEL, reside on die 620, 630, 640, 650, respectively. The group of four VCSEL apertures 615, 625, 635, 645, each typically emitting at a different wavelength, is repeated 12 times to provide a total of 48 VCSEL apertures. Typically, in order to keep different wavelength emitting VCSEL apertures 615, 625, 635, 645 as close together as possible, die 620, 630, 640, 645 are arranged into closely spaced two by two groups 661, 662, 663, 664, 665, 666, 667, 668, 669, 670, 671, 672. Note that VCSEL apertures 615, 625, 635, 645 are positioned so that they are at the inner corners of die 620, 630, 640, 650. However, configuration 601 is merely exemplary and may be modified to accommodate a different number of optical fibers and wavelengths. For example, if more than four wavelengths are to be used, non-rectangular die such as those described in U.S. patent application Ser. No. 10/370,853 filed Feb. 21, 2003 and incorporated by reference may be used in accordance with the invention.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A parallel wavelength division multiplexing transmitter comprising:

a first VCSEL die in a first group, said first VCSEL die comprising a first two dimensional single wavelength monolithic VCSEL array, said first two dimensional single wavelength monolithic VCSEL array operable to emit light at a first wavelength;

a second VCSEL die in said first group and proximate to said first VCSEL die, said second VCSEL die comprising a second two dimensional single wavelength monolithic VCSEL array, said second two dimensional single wavelength monolithic VCSEL array operable to emit light at a second wavelength;

a third VCSEL die in said first group and proximate to said first VCSEL die, said third VCSEL die comprising a third two dimensional single wavelength monolithic VCSEL array operable to emit light at a third wavelength;

a fourth VCSEL die in said first group and proximate to said first VCSEL die, said fourth VCSEL die comprising a fourth two dimensional single Wavelength monolithic VCSEL array operable to emit light at a fourth wavelength, such that said first, second, third and fourth wavelengths are distinct from one another; and a first, a second, a third and a fourth optical fiber are configured such that each one of said first, second, third and fourth optical fiber is optically coupled to said first, second, third and fourth two dimensional single wavelength monolithic VCSEL arrays.

2. The apparatus of claim 1 wherein said four VCSEL die are laid out in a two by two pattern.

3. The apparatus of claim 1 further comprising a second group of VCSEL die.

4. The apparatus of claim 3 wherein said second group comprises four VCSEL die.

5. The apparatus of claim 1 where said first optical fiber is coupled to said first and said second two dimensional single wavelength monolithic VCSEL arrays using a filterless parallel WDM multiplexer.

6. The apparatus of claim 1 wherein said first VCSEL die is substantially square in shape.

7. A parallel wavelength division multiplexing transmitter comprising:

a first VCSEL die in a first group, said first VCSEL die comprising a first plurality of VCSEL apertures arranged in a first two dimensional array, each of said first plurality of VCSEL apertures operable to emit light at a first wavelength;

a second VCSEL die in said first group and proximate to said first VCSEL die, said second VCSEL die comprising a second plurality of VCSEL apertures arranged in a second two dimensional array, each of said second plurality of VCSEL apertures operable to emit light at a second wavelength, such that said second wavelength is different from said first wavelength; and a first optical fiber optically coupled to exactly one of said first plurality of VCSEL apertures and exactly one of said second plurality of VCSEL apertures.

8. The apparatus of claim 7 further comprising a second optical fiber optically coupled to exactly one of said first plurality of VCSEL apertures and exactly one of said second plurality of VCSEL apertures such that each one of said first and said second plurality of VCSEL apertures is not optically coupled to both said first and said second optical fibers.

9. The apparatus of claim 7 wherein said first two dimensional array is a two by two array.

10. The apparatus of claim 7 wherein said first and said second VCSEL die are mounted using solder bumps to allow solder reflow alignment.

11. The apparatus of claim 7 Wherein said optical fiber is optically coupled to exactly one of said first plurality of VCSEL apertures and exactly one of said second plurality of VCSEL apertures using a filterless parallel WDM multiplexer.

12. The apparatus of claim 7 wherein said first VCSEL die is polygonal in shape.

13. A method for a parallel wavelength division multiplexing transmitter comprising:

providing a first VCSEL die in a first group, said first VCSEL die comprising a first plurality of VCSEL apertures arranged in a first two dimensional array, each of said first plurality of VCSEL apertures operable to emit light at a first wavelength;

providing a second VCSEL die in said first group and proximate to said first VCSEL die, said second VCSEL die comprising a second plurality of VCSEL apertures arranged in a second two dimensional array, each of said second plurality of VCSEL apertures operable to emit light at a second wavelength, such that said second wavelength is different from said first wavelength; and providing a first optical fiber optically coupled to exactly one of said first plurality of VCSEL apertures and exactly one of said second plurality of VCSBL apertures.

14. The method of claim 13 further comprising providing a second optical fiber optically coupled to exactly one of said first plurality of VCSEL apertures and exactly one of said second plurality of VCSEL apertures such that each one of said first and said second plurality of VCSEL apertures is not optically coupled to both said first and said second optical fibers.

15. The method of claim 13 wherein said first VCSEL die is polygonal in shape.

16. The method of claim 13 wherein said first and said second VCSEL die are mounted using solder bumps to allow solder reflow alignment.

* * * * *